United States Patent
Pinhas et al.

[11] Patent Number: 6,037,902
[45] Date of Patent: Mar. 14, 2000

[54] INTRUSION DETECTION SYSTEMS EMPLOYING ACTIVE DETECTORS

[75] Inventors: Yizhaq Pinhas, Shoham; Efim Okun, Petach Tikva, both of Israel

[73] Assignee: Visonic Ltd, Tel Aviv, Israel

[21] Appl. No.: 09/064,583

[22] Filed: Apr. 22, 1998

[30] Foreign Application Priority Data

Jul. 11, 1997 [IL] Israel ......................................... 121285

[51] Int. Cl.[7] ............................ H01Q 3/02; G08B 19/00; G01S 13/00
[52] U.S. Cl. .................................. 343/700 MS; 342/28; 340/522
[58] Field of Search .............................. 343/700 MS, 702

[56] References Cited

U.S. PATENT DOCUMENTS

| | | | |
|---|---|---|---|
| 4,208,660 | 6/1980 | Mcowen, Jr. ............................ | 343/769 |
| 4,291,312 | 9/1981 | Kaloi .................................. | 343/700 MS |
| 4,547,779 | 10/1985 | Sanford et al. ................... | 343/700 MS |
| 5,023,594 | 6/1991 | Wallace ..................................... | 340/552 |
| 5,237,330 | 8/1993 | Yaacov et al. ............................ | 342/28 |
| 5,355,143 | 10/1994 | Zurcher et al. ................... | 343/700 MS |
| 5,491,467 | 2/1996 | Tracy et al. .............................. | 340/552 |
| 5,517,163 | 5/1996 | Sagawa et al. .......................... | 333/222 |
| 5,617,104 | 4/1997 | Das .................................... | 343/700 MS |
| 5,652,595 | 7/1997 | Ahrens et al. ................... | 343/700 MS |
| 5,680,144 | 10/1997 | Sanad ............................... | 343/700 MS |

FOREIGN PATENT DOCUMENTS

| | | | |
|---|---|---|---|
| 0 342 175 A2 | 11/1989 | European Pat. Off. ......... | H01Q 9/04 |
| 0 646 986 A1 | 4/1995 | European Pat. Off. ......... | H01Q 9/04 |
| 2 131 232 | 6/1984 | United Kingdom ............. | H01Q 1/38 |
| WO 96/27219 A1 | 9/1996 | WIPO .............................. | H01Q 9/42 |

OTHER PUBLICATIONS

"Astra"—a Tradename by U.K. Companies Guardall Ltd.
"Mirage"—a Tradename by Texecom Ltd. (1996).

*Primary Examiner*—Don Wong
*Assistant Examiner*—Jennifer H. Malos
*Attorney, Agent, or Firm*—Darby & Darby

[57] ABSTRACT

This invention discloses a microwave transceiver suitable for use in an intrusion detection system including a microwave radiation generator, a printed antenna on a first side of a printed circuit board for radiating the microwave radiation generated by the microwave generator, and a ground plane on a second side of the printed circuit board and having an outer edge which is generally coextensive with an outer edge of the printed antenna.

40 Claims, 3 Drawing Sheets

6,037,902

INTRUSION DETECTION SYSTEMS EMPLOYING ACTIVE DETECTORS

FIELD OF THE INVENTION

The present invention relates to intrusion detection systems generally and more particularly to intrusion detection systems employing active detectors.

BACKGROUND OF THE INVENTION

Various types of intrusion detection systems employing active detectors are known in the art. U.S. Pat. Nos. 5,023,594 and 5,491,467 describe location independent intrusion detection systems employing a microwave transceiver which transmits and receives microwave radiation having frequencies greater than 1 Gigahertz, to detect the presence of an object within a given area.

Recent international telecommunication standards, particularly the Interim European telecommunication Standard ETS 300 440 place severe restrictions on the peak power of harmonics of the microwave radiation being transmitted. One way to meet these standards is by providing metal shielding around the microwave radiation transmitter.

Prior art devices such as an intrusion detection system manufactured and marketed by U.K. companies Guardall Ltd. under the tradename Astra and by Texecom Ltd. under the trade name Mirage, employ a metal shield which, together with the ground plane, nearly surrounds the microwave transceiver other than the antenna.

SUMMARY OF THE INVENTION

The present invention seeks to provide an intrusion detection system employing an active detector which meets the requirements of international standards on the peak power of harmonics of the microwave radiation being transmitted, without requiring extensive shielding of the transmitter.

There is thus provided in accordance with a preferred embodiment of the present invention a microwave transceiver suitable for use in an intrusion detection system and including a microwave radiation generator, a printed antenna for radiating the microwave radiation generated by the microwave radiation generator and a ground plane having an outer edge which is generally coextensive with an outer edge of the printed antenna.

There is also provided in accordance with a preferred embodiment of the present invention a microwave transceiver suitable for use in an intrusion detection system including a microwave radiation generator and a printed antenna for radiating the microwave radiation generated by the microwave generator, the printed antenna having an elongate portion extending along an antenna axis and a stub portion extending outwardly from the elongate portion, perpendicular to the antenna axis, in the plane of the elongate portion.

The stub portion is preferably shorted to ground.

There is additionally provided in accordance with a preferred embodiment of the present invention an intrusion detection system including a microwave transceiver having generally suppressed second harmonics and comprising a microwave radiation generator having non-shielded oscillator circuitry and a printed antenna for radiating the microwave radiation generated by the microwave generator.

In accordance with a preferred embodiment of the present invention, the microwave generator includes a dielectric coaxial resonator which is tuned after mounting onto a circuit board by positioning a center wire therein.

Additionally in accordance with a preferred embodiment of the present invention the microwave generator includes a non-pretuned resonator which is accessible for tuning following mounting thereof onto a circuit board.

There is also provided in accordance with a preferred embodiment of the present invention an intrusion detector including a microwave transceiver as described hereinabove.

BRIEF DESCRIPTION OF THE DRAWINGS

The present invention will be understood and appreciated more fully from the following detailed description, taken in conjunction with the drawings in which.

DETAILED DESCRIPTION OF A PREFERRED EMBODIMENT

Figure 1A:
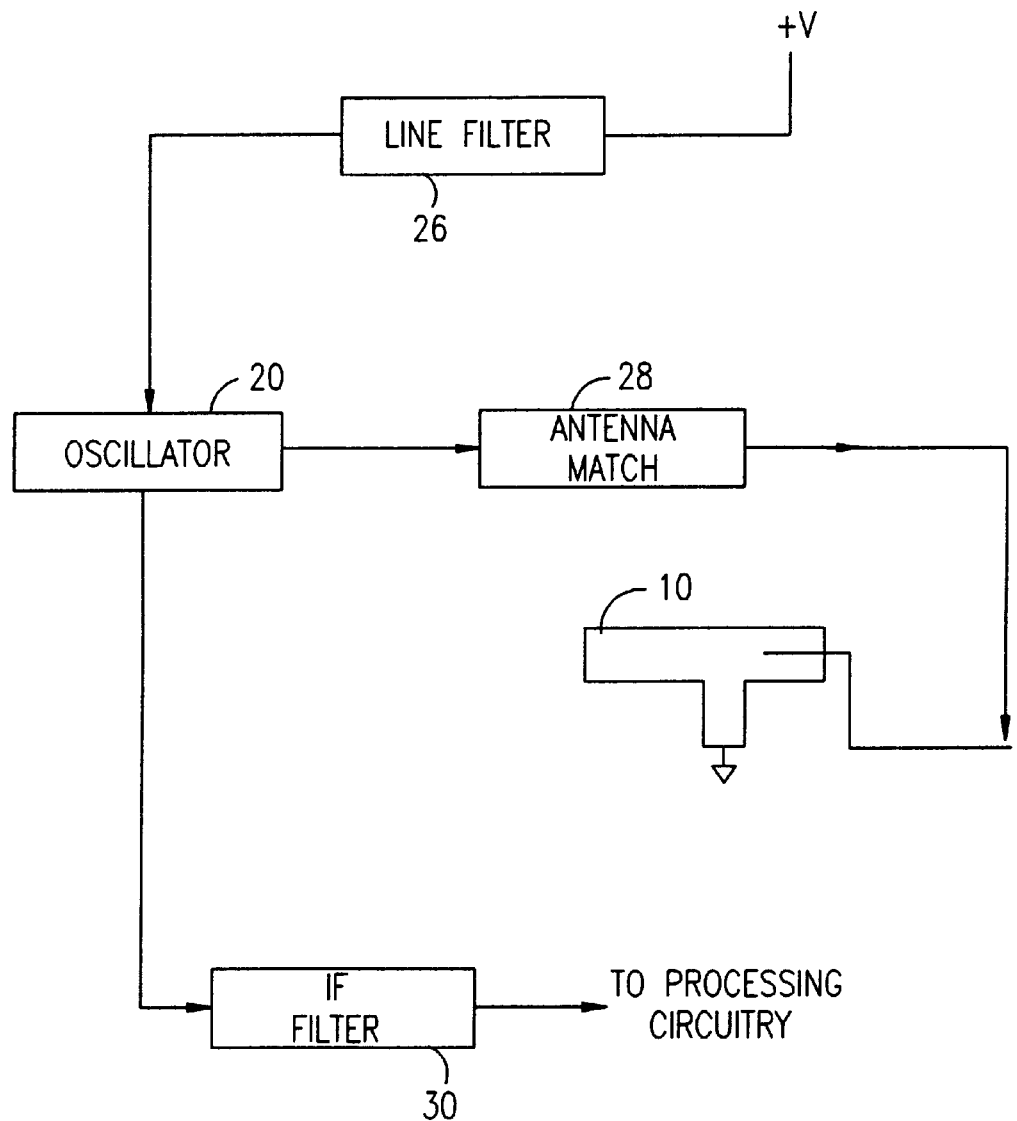
FIGS. 1A and 1B are respectively a generalized block diagram illustration and a generalized schematic illustration of an intrusion detector constructed and operative in accordance with a preferred embodiment of the present invention.
Figure 1B:
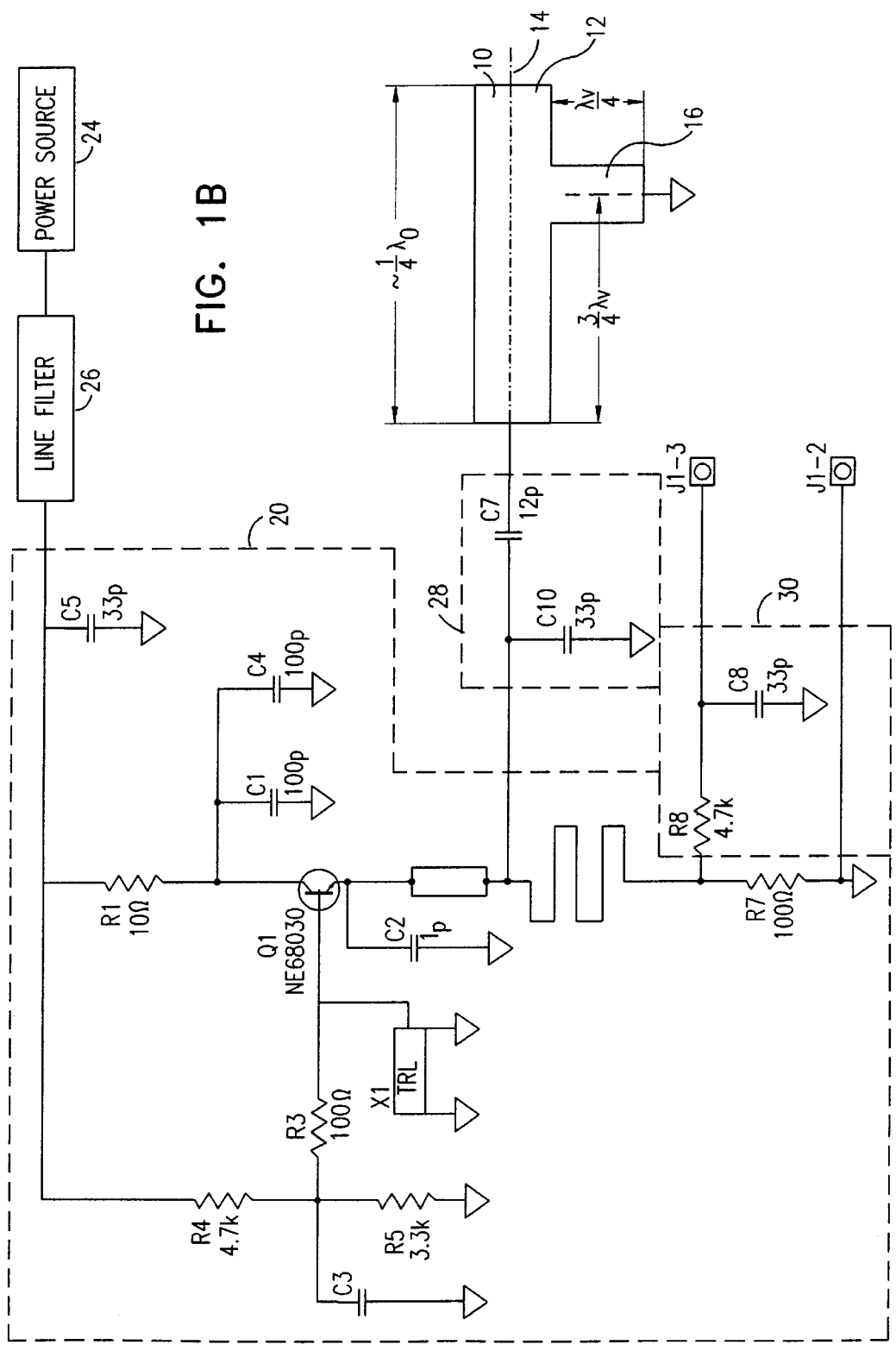

Reference is now made to FIGS. 1A and 1B which illustrate the microwave detection sub-system of an intrusion detector constructed and operative in accordance with a preferred embodiment of the present invention.

The microwave detection subsystem of the present invention is particularly characterized in that it comprises a printed antenna 10 having an elongate portion 12 extending along an antenna axis 14 and a stub portion 16 extending outwardly from the elongate portion 12, perpendicular to the antenna axis 14, in the plane of the elongate portion 12. Stub portion 16 is preferably grounded at its end. Printed antenna 10 is coupled to a microwave transceiver, principal components of which are illustrated in FIGS. 1A and 1B.

Figure 3:
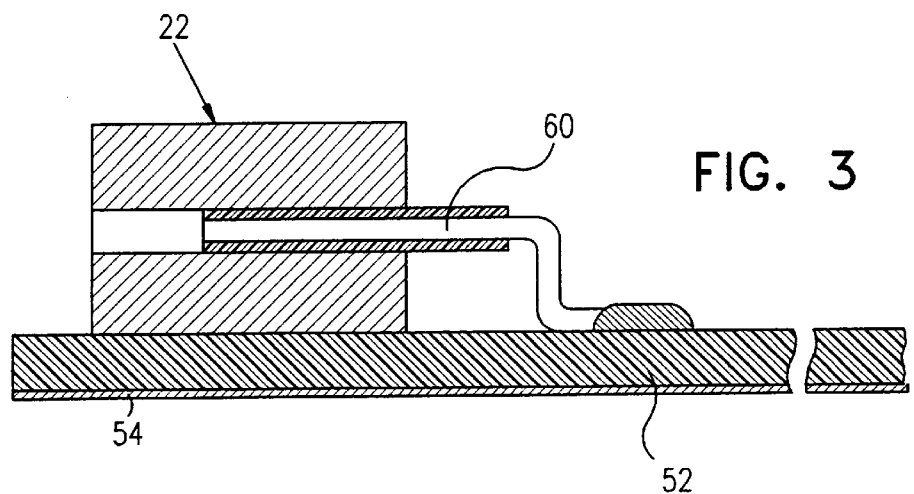
FIG. 3 is a sectional illustration, taken along lines III—III in FIG. 2, of a portion of a microwave transceiver module constructed and operative in accordance with a preferred embodiment of the present invention.

The microwave transceiver comprises an oscillator 20 which preferably comprises a quarter wave dielectric coaxial resonator 22, a preferred embodiment of which is illustrated in FIG. 3. Oscillator 20 is operative to both generate microwave energy and mix the received microwave energy. Oscillator 20 receives electrical power from a power source 24, such as a battery, via line filter circuitry 26. Microwave energy generated by oscillator 20 is supplied via antenna matching circuitry 28 to printed antenna 10.

The oscillator 20 also provides an output via an IF filter 30 to processing circuitry (not shown). The various components of the elements of the circuitry in FIG. 1A are indicated, together with preferred values thereof, in FIG. 1B, which is believed to be self-explanatory.

It is noted that as illustrated in FIG. 1B, the axial length of printed antenna 10 along antenna axis 14 is ¼ lambda (air), while the distance of the center line of stub 16 to the furthest end of antenna 10 is preferably ¾ lambda (PCB). The length of stub 16 is preferably ¼ lambda (PCB). It is a particular feature of the present invention that this antenna arrangement provides strong attenuation of at least the second and preferably also higher harmonics of the main frequency of the oscillator 20.

Figure 2:
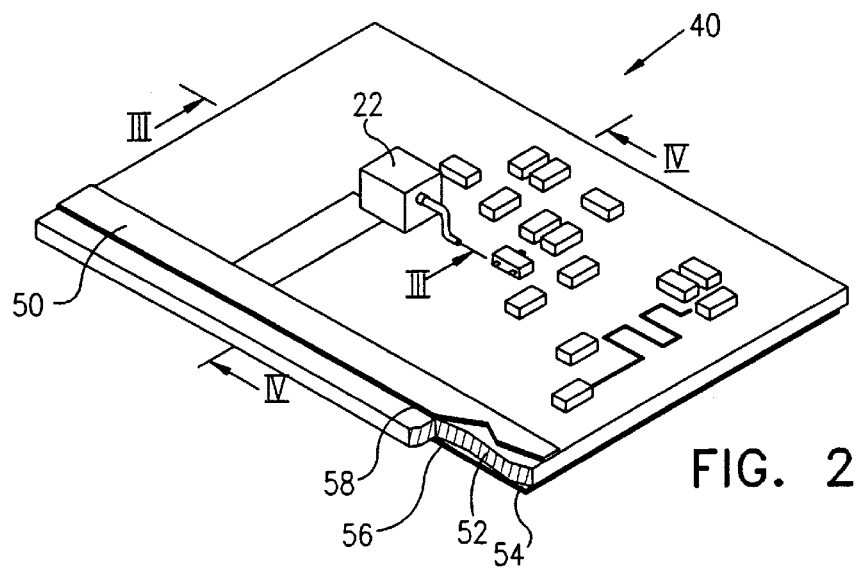
FIG. 2 is a pictorial illustration of a microwave transceiver module constructed and operative in accordance with a preferred embodiment of the present invention showing the configuration of the printed antenna and the relative positions of the printed antenna and the ground plane.

Reference is now made to FIG. 2, which illustrates, in pictorial illustration, a microwave transceiver constructed and operative in accordance with a preferred embodiment of the present invention comprising a microwave radiation generator, indicated generally by reference numeral 40 and a printed antenna 50 disposed on a first side of a printed circuit board 52 for radiating the microwave radiation generated by the microwave generator.

Figure 4:
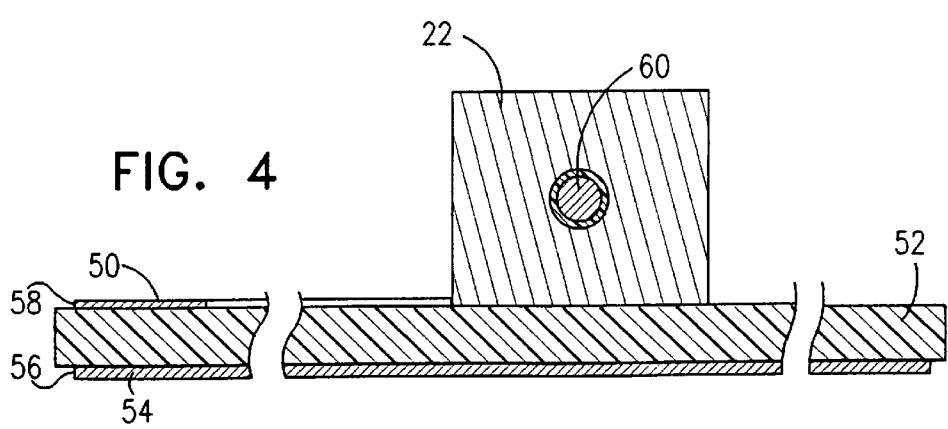
FIG. 4 is a sectional illustration, taken along lines IV—IV in FIG. 2, of a portion of a microwave transceiver module constructed and operative in accordance with a preferred embodiment of the present invention, illustrating a ground plane having an outer edge which is generally coextensive with an outer edge of the printed antenna.

In accordance with a preferred embodiment of the present invention there is provided a ground plane 54 on a second side of the printed circuit board 52 which ground plane has an outer edge 56 which is generally coextensive with an outer edge 58 of the printed antenna 50, as illustrated clearly in FIG. 4. Furthermore, all of the discrete circuit components are located on the first side of the printed circuit board.

Preferably, the apparatus of FIGS. 1A and 1B is constructed in the manner illustrated in FIG. 2. It is a particular feature of the present invention that the configuration of FIG. 2 provides strong attenuation of at least the second and preferably also higher harmonics of the main frequency of the oscillator 20.

It is also a particular feature of the present invention that the microwave generator includes a dielectric coaxial resonator 22 (FIG. 2) of the type shown in FIG. 3, which is tuned after mounting onto a circuit board by positioning a center insulated wire 60 therein. This construction enables the oscillator to be conveniently tuned after having been mounted onto circuit board 52.

It is a particular feature of the present invention that there is provided an intrusion detection system including a microwave transceiver having generally suppressed second harmonics and comprising a microwave radiation generator having non-shielded oscillator circuitry.

It will be appreciated by persons skilled in the art that the present invention is not limited by what has been particularly shown and described hereinabove. Rather the scope of the present invention includes both combinations and subcombinations of the various features described hereinabove as well as variations and further developments thereof which would occur to a person skilled in the art upon reading the foregoing description and which are not in the prior art.

We claim:

1. A microwave transceiver suitable for use in an intrusion detection system including:
   a microwave radiation generator;
   an elongated printed antenna, having an elongate edge, on a first side of a printed circuit board for radiating the microwave radiation generated by the microwave generator; and
   a ground plane on a second side of said printed circuit board which is substantially wider than said elongated printed antenna and has an outer edge which is generally coextensive with said elongate edge of the printed antenna and at least one outer edge which is not generally coextensive with an edge of said printed antenna.

2. A microwave transceiver according to claim 1 and wherein said microwave generator is located on said first side of said printed circuit board.

3. A microwave transceiver according to claim 2 and wherein substantially all of the components of the transceiver are located on said first side of said printed circuit board.

4. A microwave transceiver according to claim 2 and wherein said printed antenna has an elongate portion extending along an antenna axis and a stub portion extending outwardly from the elongate portion, perpendicular to the antenna axis, in the plane of the elongate portion.

5. A microwave transceiver according to claim 4 and wherein the distance of the center line of said stub to the furthest end of said printed antenna is ¾ lambda of said microwave radiation in a dielectric on which said antenna is printed.

6. A microwave transceiver according to claim 4 and wherein said stub portion is grounded.

7. A microwave transceiver according to claim 1 and wherein said printed antenna has an elongate portion extending along an antenna axis and a stub portion extending outwardly from the elongate portion, perpendicular to the antenna axis, in the plane of the elongate portion.

8. A microwave transceiver according to claim 7 and wherein the distance of the center line of said stub to the furthest end of said printed antenna is ¾ lambda of said microwave radiation in a dielectric on which said antenna is printed.

9. A microwave transceiver according to claim 7 and wherein said stub portion is grounded.

10. A microwave transceiver according to claim 1 and wherein said printed antenna has a length of ¼ lambda of said microwave radiation in air.

11. A microwave transceiver according to claim 1 and wherein substantially all of the components of the transceiver are located on said first side of said printed circuit board.

12. Apparatus according to claim 1 and wherein said microwave generator includes a dielectric coaxial resonator which is tuned after mounting onto a circuit board by positioning a center wire therein.

13. A microwave transceiver suitable for use in an intrusion detection system including:
   a microwave radiation generator;
   a printed antenna for radiating the microwave radiation generated by the microwave generator, the printed antenna having an elongate portion extending along an antenna axis and a stub portion extending outwardly from the elongate portion, perpendicular to the antenna axis, in the plane of the elongate portion and wherein said printed antenna has a length of ¼ lambda of said microwave radiation in air.

14. A microwave transceiver according to claim 13 and wherein the distance of the center line of said stub to the furthest end of said printed antenna is ¾ lambda of said microwave radiation in a dielectric on which said antenna is printed.

15. A microwave transceiver according to claim 13 and wherein said stub portion is grounded.

16. A microwave transceiver according to claim 13 and wherein said printed antenna has a length of ¼ lambda of said microwave radiation in air.

17. A microwave transceiver according to claim 13 and wherein substantially all of the components of the transceiver are located on said first side of said printed circuit board.

18. Apparatus according to claim 13 and wherein said microwave generator includes a dielectric coaxial resonator which is tuned after mounting onto a circuit board by positioning a center wire therein.

19. Apparatus according to claim 13 and wherein said microwave generator includes a non-pretuned resonator which is accessible for tuning following mounting thereof onto a circuit board.

20. An intrusion detector comprising a microwave transceiver including:

a microwave radiation generator;

an elongated printed antenna, having an elongate edge, on a first side of a printed circuit board for radiating the microwave radiation generated by the microwave generator; and a ground plane on a second side of said printed circuit board which is substantially wider than said elongated printed antenna and has an outer edge which is generally coextensive with said elongate edge of the printed antenna and at least one outer edge which is not generally coextensive with an edge of said printed antenna.

21. An intrusion detection system according to claim 20 and wherein said microwave generator is located on said first side of said printed circuit board.

22. An intrusion detection system according to claim 21 and wherein substantially all of the components of the transceiver are located on said first side of said printed circuit board.

23. An intrusion detection system according to claim 21 and wherein said printed antenna has an elongate portion extending along an antenna axis and a stub portion extending outwardly from the elongate portion, perpendicular to the antenna axis, in the plane of the elongate portion.

24. An intrusion detection system according to claim 23 and wherein said stub portion is grounded.

25. An intrusion detection system according to claim 23 and wherein the distance of the center line of said stub to the furthest end of said printed antenna is ¾ lambda of said microwave radiation in a dielectric on which said antenna is printed.

26. An intrusion detection system according to claim 25 and wherein said stub portion is grounded.

27. An intrusion detection system according to claim 20 and wherein said printed antenna has an elongate portion extending along an antenna axis and a stub portion extending outwardly from the elongate portion, perpendicular to the antenna axis, in the plane of the elongate portion.

28. An intrusion detection system according to claim 27 and wherein said stub portion is grounded.

29. An intrusion detection system according to claim 27 and wherein the distance of the center line of said stub to the furthest end of said printed antenna is ¾ lambda of said microwave radiation in a dielectric on which said antenna is printed.

30. An intrusion detection system according to claim 29 and wherein said stub portion is grounded.

31. An intrusion detection system according to claim 20 and wherein said printed antenna has a length of ¼ lambda of said microwave radiation in air.

32. An intrusion detection system according to claim 20 and wherein substantially all of the components of the transceiver are located on said first side of said printed circuit board.

33. Apparatus according to claim 20 and wherein said microwave generator includes a dielectric coaxial resonator which is tuned after mounting onto a circuit board by positioning a center wire therein.

34. An intrusion detector comprising a microwave transceiver including:

a microwave radiation generator;

a printed antenna on a first side of a printed circuit board for radiating the microwave radiation generated by the microwave generator, the printed antenna having an elongate portion extending along an antenna axis and a stub portion extending outwardly from the elongate portion, perpendicular to the antenna axis, in the plane of the elongate portion and wherein said printed antenna has a length of ¼ lambda of said microwave radiation in air.

35. An intrusion detection system according to claim 34 and wherein the distance of the center line of said stub to the furthest end of said printed antenna is ¾ lambda of said microwave radiation in a dielectric on which said antenna is printed.

36. An intrusion detection system according to claim 34 and wherein said stub portion is grounded.

37. An intrusion detection system according to claim 34 and wherein substantially all of the components of the transceiver are located on said first side of said printed circuit board.

38. Apparatus according to claim 34 and wherein said microwave generator includes a dielectric coaxial resonator which is tuned after mounting onto a circuit board by positioning a center wire therein.

39. Apparatus according to claim 34 and wherein said microwave generator includes a non-pretuned resonator which is accessible for tuning following mounting thereof onto a circuit board.

40. Apparatus according to claim 34 and wherein said microwave generator includes a non-pretuned resonator which is accessible for tuning following mounting thereof onto a circuit board.

* * * * *